United States Patent [19]
McKinnon

[11] Patent Number: 4,804,920
[45] Date of Patent: Feb. 14, 1989

[54] NUCLEAR MAGNETIC RESONANCE TOMOGRAPHY METHOD

[75] Inventor: Graeme C. McKinnon, Ellerau, Fed. Rep. of Germany

[73] Assignee: U.S. Philips Corporation, New York, N.Y.

[21] Appl. No.: 54,478

[22] Filed: May 27, 1987

[30] Foreign Application Priority Data

May 31, 1986 [DE] Fed. Rep. of Germany ....... 3618432

[51] Int. Cl.⁴ ............................................. G01R 33/20
[52] U.S. Cl. .................................... 324/309; 324/312
[58] Field of Search ............... 324/309, 307, 312, 314; 128/653

[56] References Cited
U.S. PATENT DOCUMENTS 4,665,365 5/1987 Glover et al. ........................ 324/307
4,706,025 11/1987 Edelstein et al. ................... 324/309

Primary Examiner—Stewart J. Levy
Assistant Examiner—Louis M. Arana

[57] ABSTRACT

The invention relates to a nuclear magnetic resonance tomography method, by which in each sequence after a reading stage in which the nuclear magnetic resonance signals produced at the examination area are recorded, the magnetic gradient fields are switched on and off in such a manner that the time integral across all magnetic gradient fields is equal and different from zero for each sequence.

5 Claims, 4 Drawing Sheets

NUCLEAR MAGNETIC RESONANCE TOMOGRAPHY METHOD

The invention relates to a method for nuclear magnetic resonance tomography, in which in the presence of a homogeneous stationary magnetic field a large number of sequences acts upon an examination area, each sequence including the production of a single high-frequency pulse, the switching-on of at least one magnetic gradient field having a gradient varying in value or direction from sequence to sequence and the recording of a nuclear magnetic resonance echo signal during or after the action of this magnetic field.

Such a method is known from the magazine "Phys. Med. Biol.", Vol. 25, p. 751 to 756. The known method—often also designated as spin warp imaging method—represents a variation of the Fourier imaging methods, in which at a preparation or encoding stage a magnetic gradient field is switched, the gradient being variable from sequence to sequence. It becomes possible only by this variation of the value of the gradient to determine the nuclear magnetization distribution in a plane or in a layer of the examination area with spatial resolution.

Besides the Fourier imaging methods, so-called projection reconstruction methods are also known, in which the direction of the gradient of a magnetic gradient field is varied from sequence to sequence, while its value remains constant. Thus, the nuclear magnetization distribution can also be determined with resolution as a function of location in a bidimensional region.

It is known that in the known methods the measuring time required for recording the nuclear magnetic resonance signals from which the nuclear magnetization distribution in a layer of the examination area is obtained can be considerably reduced in that the high-frequency pulses follow each other at very small distances. However, this means that at the beginning of a sequence the spin nuclei excited by the preceding sequence have not yet reached the state of equilibrium. In order to suppress the influence of the preceding sequence on the nuclear magnetic resonance signal, which is produced by an immediately following sequence at the examination area, it is known to dephase the nuclear magnetization at the examination area by the application of a magnetic gradient field immediately before the high-frequency pulse of a next sequence.

As a result, however, artefacts can be obtained, which are due to the nuclear magnetization produced in the last sequence but one, which precedes the relevant sequence. These artefacts, which appear as bright lines in the image of the reconstructed layer, are the more strongly pronounced as the flip angle of the high-frequency pulse is larger, the transverse relaxation time of the nuclear magnetization in the layer is longer and the period duration of a sequence is shorter.

The invention has for its object to carry out a method of the kind mentioned in the opening paragraph in such a manner that also with a short period duration of a sequence images can be obtained which are to a great extent free from artefacts.

According to the invention, this object is achieved in that after the recording of the nuclear magnetic resonance signal at least one magnetic gradient field is applied having such a direction and value that the time integral across all the magnetic gradient fields active during a sequence is equal and different from zero for all sequences.

The invention is based on the recognition of the fact that as nuclear magnetic resonance signals not only signals obtained by the free induction decay (so-called FID signals), but also so-called spin echo signals obtained by the cooperation of the high-frequency pulses of two successive sequences and further also stimulated echo signals obtained by the cooperation of the high-frequency pulses of three successive sequences can occur. The spin echo signals and the stimulated echo signals have components which have a phase position deviating from the phase position of the FID signals. However, these components are suppressed by the variation with time according to the invention of the magnetic gradient fields. Moreover, these signals have components which have the same phase position as the FID signal. These components are not suppressed because the effect of the magnetic gradient fields on these components is compensated for if according to the invention the time integral across the gradient fields active during one sequence is equal and different from zero for all sequences (for examination of a layer).

The invention can be used both in a multidimensional Fourier imaging method and in a projection reconstruction method.

In the Fourier imaging method, in which each sequence comprises successively a selection stage in which a high-frequency pulse and a first magnetic gradient field act upon the examination area, a preparation stage in which a second magnetic gradient field having a gradient variable in value from sequence to sequence acts upon the examination area and a reading stage in which a third magnetic gradient field acts upon the examination area and the nuclear magnetic resonance signal then produced is recorded, it is ensured in an embodiment according to the invention that the reading stage is followed by a further stage, in which the second-magnetic gradient field is switched so that the time integral across the second magnetic gradient field has during one sequence the same value—preferably zero—for all sequences.

In a projection reconstruction method, in which each sequence comprises a selection stage in which a high-frequency pulse and a first magnetic gradient field act upon the examination area and a reading stage in which a further magnetic gradient field having the same amplitude for all sequences, but a direction variable from sequence to sequence, is switched and in which a nuclear magnetic resonance signal produced at the examination area is recorded, it is ensured in an embodiment according to the invention that after the reading stage a magnetic gradient field is switched on and off, whose direction is opposite to the direction of the magnetic gradient field active in the reading stage and whose value is chosen so that the time integral across the second magnetic gradient field is zero for all sequences.

In both cases, in a further embodiment according to the invention, it is advantageous that in the stage following the reading stage the first magnetic gradient field having a phase position equal for all sequences is switched on and off. This embodiment is of particular importance for projection reconstruction methods; in a Fourier imaging method, instead of the first magnetic gradient field, in the further stage also the magnetic gradient field active in the reading stage could be switched in a suitable manner.

An arrangement for carrying out the method comprising means for producing a homogeneous stationary magnetic field, means for producing high-frequency pulses, means for producing at least one magnetic gradient field having a value or direction of the gradient variable from sequence to sequence and means for recording nuclear magnetic resonance signals, is characterized in that the means for producing the gradient field or gradient fields are controlled by control means in such a manner that the time integral across all the magnetic gradient fields active during one sequence is for all sequences equal and different from zero.

In order that the invention may be readily carried out, it will now be described more fully with reference to the accompanying drawing, in which.

Figure 1:
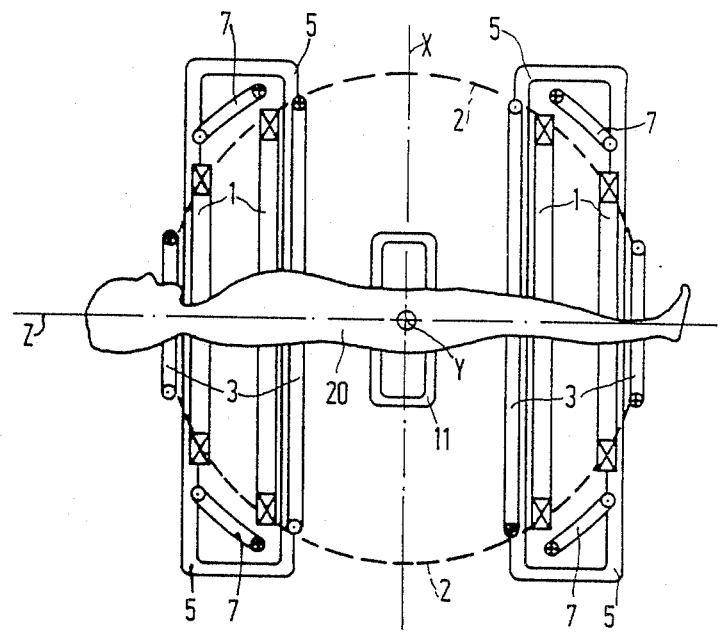
FIG. 1 shows a nuclear magnetic resonance tomography apparatus, in which the invention can be used.

The nuclear magnetic resonance tomography apparatus shown in FIG. 1 comprises an arrangement comprising four coils 1 for producing a homogeneous stationary magnetic field, which is, for example, 2T. This field extends in the z direction of a Cartesian xyz coordinate system. The coils 1 arranged concentrical to the z axis can be provided on a spherical surface 2. The patient 20 to be examined is present in the interior of these coils.

Four coils 3 for producing a magnetic field Gz extending in the z direction and linearly varying in this direction are preferably arranged on the same spherical surface. Further, four coils 7 are provided, which produce a magnetic gradient field Gx also extending in the z direction (i.e. a magnetic field whose strength varies linearly in one direction), but whose gradient extends in the x direction. A magnetic gradient field Gy extending in the z direction and having a gradient in the y direction is produced by four coils 5, which may be of the same construction as the coils 7, but are arranged so that they are shifted through 90° with respect to these coils. Of these four coils only two are shown in FIG. 1. Since each of the three coils arrangements 3, 5 and 7 for producing the magnetic gradient fields Gz, Gy and Gx is arranged symmetrically to the spherical surface 2, the field strength at the centre of the sphere, which at the same time constitutes the coordinate origin of the Cartesian coordinate system is determined only by the stationary homogeneous magnetic field of the coil arrangement 1.

Further, a high-frequency coil 11 is arranged symmetrically to the plane z=0 of the coordinate system, which is formed so that a substantially homogeneous high-frequency magnetic field extending in the x direction, i.e. at right angles to the direction of the stationary homogeneous magnetic field, is produced thereby. During each high-frequency pulse, a high-frequency modulated current is supplied to the high-frequency coil by a high-frequncy generator. After each high-frequency pulse, the high-frequency coil 11 serve to receive nuclear magnetic resonance signals produced at the examination area. Instead thereof, however, a separate high-frequency reception coil may also be used.

Figure 2:
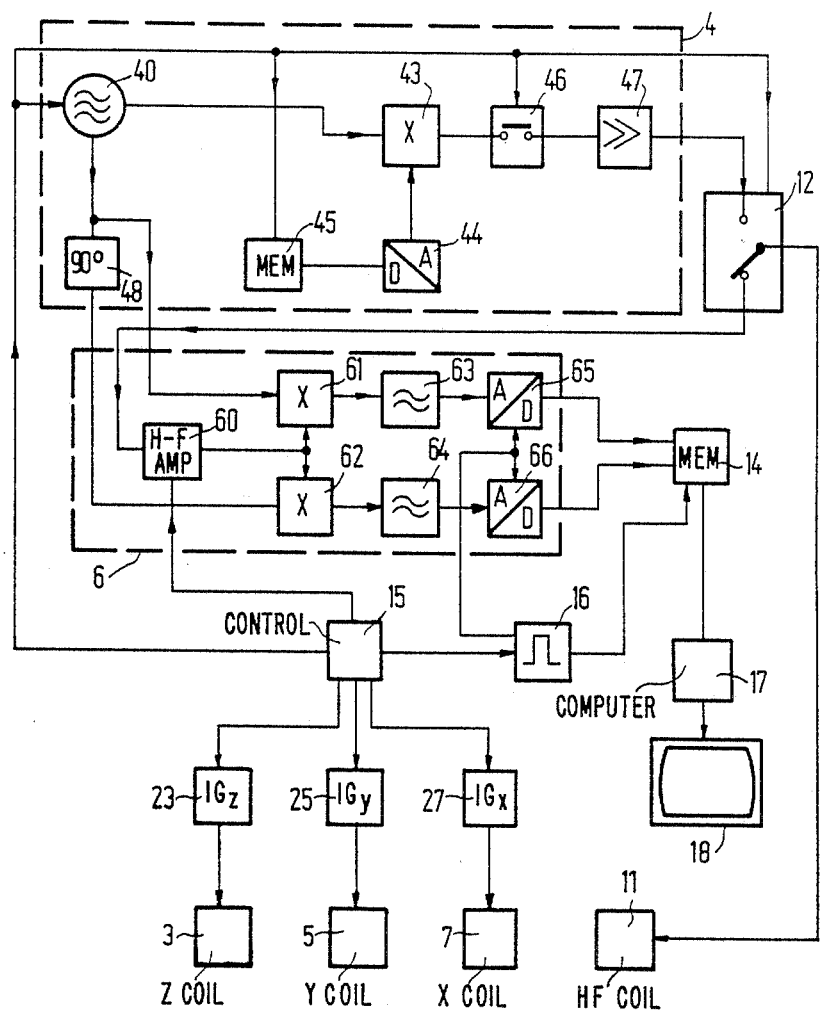
FIG. 2 shows a block circuit diagram of such an apparatus.

FIG. 2 shows a simplified block circuit diagram of this nuclear magnetic resonance tomography apparatus. The high-frequency coil 11 is connected through a change-over device 12 on the one hand to a high-frequency generator 4 and on the other hand to a high-frequency receiver 6.

The high-frequency generator 4 comprises a high-frequency generator 40 which can be digitally controlled in its frequency and which has oscillations having a frequency equal to the Larmor frequency of the atomic nuclei to be excited at the field strength produced by the coils 1. The Larmor frequency f is calculated, as known, according to the relation f=cB, where B is the magnetic induction in the stationary homogeneous magnetic field and c is the gyromagnetic ratio, which amounts, for example, for protons to 42.56 MHz/T. The output of the oscillator 40 is connected to an input of a mixer stage 43. A second input signal is supplied to the mixer stage 43 by a digital-to-analogue converter 44, whose output is connected to a digital memory 45. A sequence of digital data words representing an envelope signal is read from this memory—under the control of a control device 15.

The mixer stage 43 processes the input signals supplied to it in such a manner that the carrier oscillation modulated with the envelope signal appears at its output. The output signal of the mixer stage 43 is supplied through a switch 46 controlled by the control device 15 to a high-frequency power amplifier 47, whose output is connected to the change-over device 12. The latter is also controlled by the control device 15.

The receiver 6 comprises a high-frequency amplifier 60, which is connected to the change-over device and to which the stimulated echo signal induced in the high-frequency coil 11 is supplied, in which event the change-over device must have the corresponding switching state. The amplifier 60 has a muting circuit input, which is controlled by the control device 15 and through which it can be cut off so that the amplification is substantially zero. The output of the amplifier is connected to the first inputs of two multiplicative mixer stages 61 and 62, which each time supply an output signal corresponding to the product of their input signals. A signal having the frequency of the oscillator 40 is supplied to the second inputs of the mixer stages 61 and 62, a phase shift of 90° existing between the signals at the two inputs. This phase shift is produced by means of a phase shift member 48, whose output is connected to the input of the mixer stage 62 and whose input is connected to the input of the mixer stage 61 and to the output of the oscillator 40.

The output signal of the mixer stages 61 and 62 are each supplied through low-pass filters 63 and 64, which suppress the frequency delivered by the oscillator 40 and all the frequencies lying above it and pass low-frequency components, to an analogue-to-digital converter 65 and 66, respectively. The latter converts the analogue signals of the circuit 61 . . . 64 constituting a quadrature demodulator into digital data words, which are supplied to a memory 14. The analogue-to-digital converters 65 and 66 and the memory receive their clock pulses from a clock pulse generator 16, which can be blocked and opened through a control lead by the control device 15 so that only in a measuring interval defined by the control device 15 the signals supplied by the high-frequency coil 11 and transposed to the low-frequency range can be converted into a sequence of digital words and can be stored in the memory 14.

The data words and sample values, respectively, stored in the memory 14 are supplied to a computer, which determines therefrom the spatial distribution of the nuclear magnetization in a layer of the examination area and passes the determined distribution on to a suitable display unit for example a monitor 18.—The three coil arrangements 3, 5 and 7 are each time fed by current generators 23, 25 and 27 with a current whose variation with time can be controlled by the control device 15.

Figure 3:
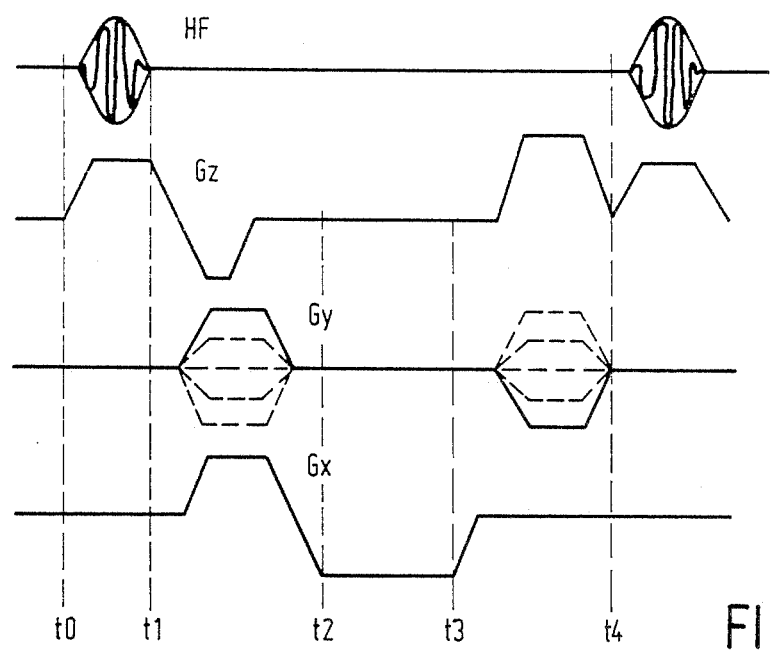
FIG. 3 shows the variation with time of different signals in a Fourier sequence.

FIG. 3 shows the variation with time of the signals produced by the high-frequency coil 11 and by the gradient coils 3, 5 and 7 in a bidimensional Fourier method, i.e. substantially only for a sequence beginning at the instant $t=t_0$ and ending at the instant $t=t_4$. In the time interval $t_0$ to $t_1$, the magnetic gradient field Gz produced by the coils 3 is switched on (FIG. 3, second line), while a high-frequency pulse HF is produced (FIG. 3 first line) when the magnetic gradient field Gz has reached a stationary value. Subsequently, the polarity of the magnetic gradient field Gz is reversed and thereafter this field is first switched off, the variation with time being chosen so that the time integral across the magnetic gradient field Gz is just zero from the centre of the high-frequency pulse HF to the switching-off instant. Thus, it is achieved that the nuclear magnetization in the layer excited by the high-frequency pulse in conjunction with the magnetic gradient field Gz and extending at right angles to the z axis has a phase position independent of the z direction.

After the high-frequency pulse, the magnetic gradient field Gy produced by the coils 5 and the generator 25 is switched on and off in the time interval of $t=t_1$ to $t=t_2$ (FIG. 3, line 3), while—as indicated by broken lines—the gradient of this field is varied from sequence to sequence. Furthermore, in the interval $t_1-t_2$ a magnetic gradient field Gx is first switched on with a first polarity, which is then changed over until at the instant $t=t_2$ the magnetic gradient field Gx has reached a, stationary value (FIG. 3, fourth line).

The magnetic gradient field Gx then remains constant till the instant $t=t_3$. In this time interval a nuclear magnetic resonance signal occurs, which reaches its maximum at the instant at which the time integral across the magnetic gradient field Gx is zero. This signal is recorded in the time interval $t_2$ to $t_3$, that is to say that the control device 15 produces an enabling signal for the clock pulse generator 16 so that the signals supplied by the high-frequency coil 11 and transposed to the low-frequency range can be converted into a sequence of digital data words and can be stored in the memory 14. Subsequently, the field Gx is also switched off.

As far as described hitherto, the method as shown in FIG. 3 is known, for example from the afore-mentioned magazine Phys. Med. Biol., Vol. 25, p. 751-756.

According to the invention, after recording of the nuclear magnetic resonance signal, the magnetic gradient field Gy is now switched on again, i.e. with a polarity opposite to that in the time interval $t_1-t_2$. Duration and strength of the magnetic gradient field are then chosen so that the time integral across the gradient of the field Gy is just zero for one sequence. At the same time, the magnetic gradient field Gz is switched on and off so that the nuclear magnetization excited in the layer is dephased.

At the instant $t=t_4$, i.e. about 30 ms after the instant $t=t_0$, the next sequence follows, the variation with time of the high-frequency pulses HF (first line) of the magnetic gradient field Gz (second line) and of the magnetic gradient field Gx (fourth line) remaining unchanged. Solely the magnetic gradient field Gy (third line) is varied in the time interval $t_1-t_2$, but this variation is compensated for by an opposite equal variation of the field Gy in the time interval $t_3-t_4$.

Figure 5:
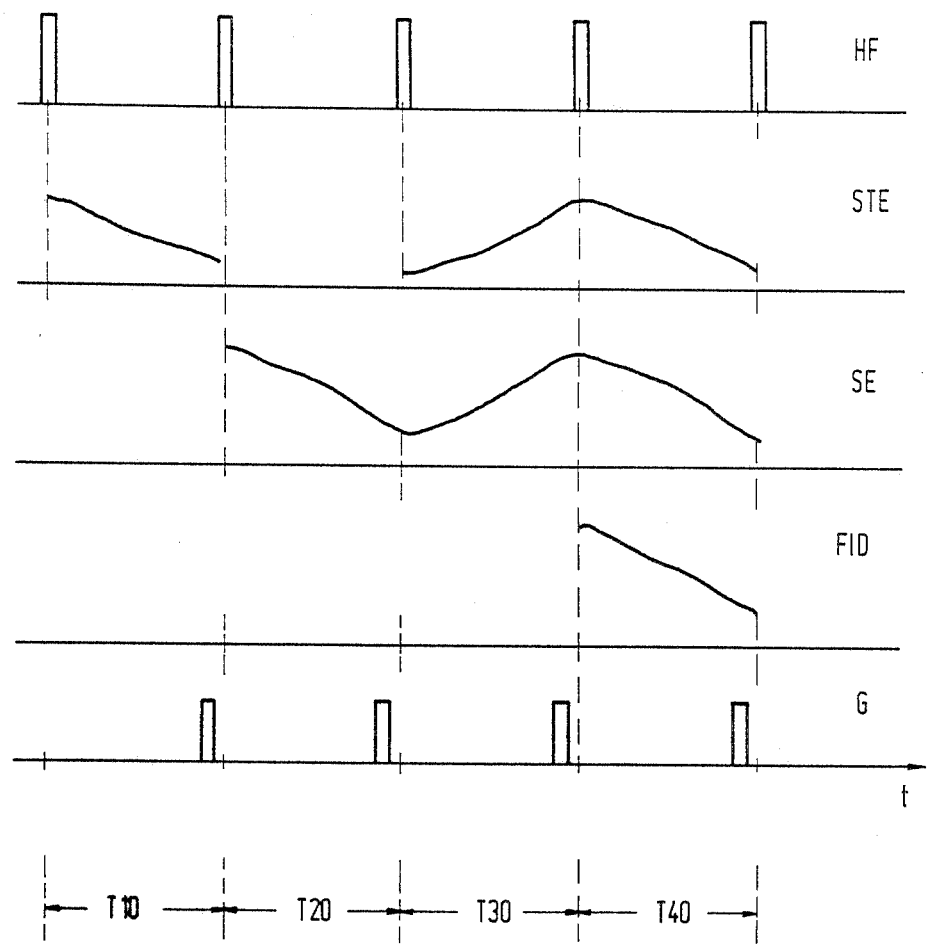
FIG. 5 shows a time diagram of different signals for explanation of the effect of the invention.

By the variation with time described it is achieved that in each sequence the excited nuclear magnetization after the reading stage ($t_2-t_3$) is each time dephased to the same extent because the time integral across the magnetic gradient fields during one sequence is equal for all sequences. The effect of this measure is further explained with reference to FIG. 5. The first line of FIG. 5 shows diagrammatically the variation with time of the high-frequency pulses HF of several successive sequences. The distance between two high-frequency pulses, i.e. the period duration of one sequence, is then about 30 ms.

It is known that stimulated echo signals can be produced by three successive high-frequency pulses. The maximum signal is then obtained when all three pulses have a flip angle of 90°, i.e. when the nuclear magnetization is triggered by each pulse through each time 90°. However, stimulated echo signals are also obtained when the high-frequency pulses have a smaller flip angle. The stimulated echo signal has its maximum in a distance in time from the third of the three high-frequency pulses, which corresponds to the distance in time between the two first high-frequency pulses. Consequently, as indicated in line 2, a stimulated echo signal STE is produced by the three first high-frequency pulses and the maximum of this signal coincides with the occurrence of the fourth high-frequency pulses. Under the influence of the inhomogeneities of the stationary magnetic field produced by the coils 1, the nuclear magnetization is dephased after the fourth high-frequency pulse so that the signal amplitude decreases with time; in contrast therewith, the phase of the echo signal is rephased before the fourth high-frequency pulse, while its amplitude increases.

By two successive high-frequency pulses, as is known, spin echo signals can also be produced—also when the second pulse is not a 180° pulse. The third line indicates the variation with time of these signals, which is obtained from the cooperation of the second and third high-frequency pulses. The second high-frequency pulse produces a FID signal which is dephased under the influence of the inhomogeneities of the stationary magnetic field in the time interval T20 after the second high-frequency pulse. After the third high-frequency pulse, a spin echo signal occurs, which reaches its maximum also during the fourth high-frequency pulse and has before this pulse a re-phasing component and after this pulse a dephasing component.

The strongest nuclear magnetic resonance signals are obtained by the FID signals which occur immediately after the individual high-frequency pulses; in FIG. 5, the FID signal associated with the fourth high-frequency pulse is shown. It is dephased in the time interval T40 after this high-frequency pulse under the influence of the inhomogeneities of the stationary magnetic field.

Although on the lines 2, 3 and 4 only the stimulated echo signal STE produced by the cooperation of the first three pulses, the spin echo signal produced by the cooperation of the second and third high-frequency pulses and the FID signal produced by the fourth high-frequency pulse are shown, it should be appreciated that further a large number of additional nuclear magnetic resonance signals are produced by the high-frequency pulses shown on the first line. By way of example, each of the high-frequency pulses shown produces a FID signal and the second to fourth high-frequency pulses also lead to the production of a stimulated echo signal, while, for example, the two first pulses also produce a spin echo signal. These additional signals are not shown, however, for the sake of clarity.

On the fifth line the variation with time of the magnetic gradient field G—essentially the field Gz—for dephasing and occurring in the time interval $t_3-t_4$ after the reading stage is shown. It can be seen therefrom that the nuclear magnetization produced by the three first pulses or the stimulated echo signal resulting therefrom is subjected several times to the effect of the dephasing magnetic gradient field. Thus, the rephasing component of the stimulated echo signal STE occurring in the reading stage in the time interval T30 after the third high-frequency pulse is subjected to the effect of the dephasing magnetic gradient fields in the time interval T10 and the time interval T20, respectively, after the first high-frequency pulse and the second high-frequency pulse, respectively. Since, as is known, a magnetic gradient field occurring between the second and the third high-frequency pulse has no effect at all, however, only the magnetic gradient field in the time interval T10 is active. As a result, the rephasing component of the stimulated echo signal is suppressed.—On the contrary, the dephasing magnetic gradient fields produced during the time interval T10, T20 and T30 act upon the dephasing component of the stimulated echo signal STE occurring in the reading stage in the time interval T40 after the fourth high-frequency pulse. However, since, as is known, the influence of a magnetic gradient field occurring between the first and the second high-frequency pulse on the stimulated echo signal can be compensated for by a magnetic gradient field occurring in the time interval after the third high-frequency pulse, but before the sampling of the stimulated echo signal, the dephasing component of the stimulated echo signal STE remains, (in the interval T40) uninfluenced by the dephasing magnetic gradient fields in the intervals T10 and T30.

The rephasing component of the spin echo signal SE occurring in the reading stage in the time interval T30 is influenced by the magnetic gradient field in the interval T20 and is thus dephased. On the contrary, the magnetic gradient fields occurring in the time intervals T20 and T30 have acted upon the dephasing component of the spin echo signal occurring in the reading stage of the interval T40. since they have the same time integral and since one magnetic gradient field occurs before and the other magnetic gradient field occurs after the last of the two pulses producing the relevant spin echo signal, its effect with respect to the dephasing component is compensated for. Consequently, the latter component remains, like the dephasing component of the stimulated echo signal, substantially uninfluenced by the magnetic gradient fields serving for dephasing. It is therefore superimposed on the FID signal produced by the fourth high-frequency pulse so that, because all three signals have the same phase position, a larger signal or a better signal-to-noise ratio is obtained.

Therefore, the invention utilizes the fact that with such small time distances of the sequences the nuclear magnetization produced by the preceding high-frequency pulses is still partially active and causes the information resulting therefrom to be added to the information which is obtained from the high-frequency pulse of the respective sequence.

Figure 4:
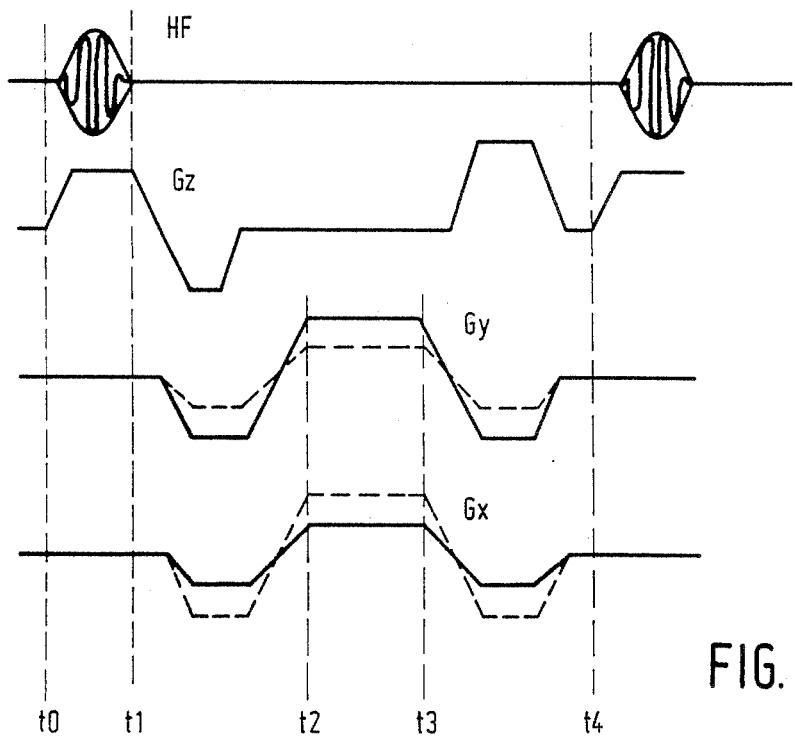
FIG. 4 shows the variation with time of these signals in a projection reconstruction sequence.

FIG. 4 shows a sequence according to the invention for a projection reconstruction method. The variation with time of the high-frequency pulses and of the magnetic gradient field Gz then substantially corresponds to the variation with time of these signals in the method shown in FIG. 3. After the high-frequency pulse (in the interval $t_0-t_1$) the magnetic gradient field Gy is then first switched on with a first polarity, which is then changed over so that at the instant $t=t_2$ this field has reached a stationary value. The magnetic gradient field Gx varies correspondingly with time—but generally at a different amplitude. The magnetic gradient fields Gx and Gy remain constant in the interval $t_2-t_3$ and in this interval the nuclear magnetic resonance signals are recorded (i.e. the clock pulse generator 16 in FIG. 2 is enabled). As far as described hitherto, this method is also known. After the reading stage, however, the polarity of the magnetic gradient fields Gx and Gy is changed over again, after which these fields are switched off, the variation with time of these fields being proportioned so that the time integral across each of these fields is zero during one sequence. At the same time, in the time interval $t_3-t_4$, the magnetic gradient field Gz for dephasing is switched on and off again.

In the next sequence, the high-frequency pulse and the magnetic gradient field Gz have the same variation with time as before. As indicated by broken lines, however, in this next sequence the gradient of the magnetic gradient field Gy is varied (for example reduced) and the gradient of the gradient field Gx is varied in opposite sense—in this example therefore enlarged. The variation of these two fields takes place in known manner so that the amount of the gradient of the magnetic gradient field resulting from these two fields—at least in the reading stage $t_2-t_3$—remains constant, while its direction varies from sequence to sequence. Also in this case, the rephasing components of the spin echo and stimulated echo signals are suppressed due to the fact that for each sequence the time integral across the magnetic gradient fields has a constant value, while the dephasing components are superimposed in correct phase relationship on the FID signals of the individual high-frequency pulses.

As already stated, the distance in time between two sequences may be 30 ms, while at the end of a first sequence the nuclear magnetization existing before this sequence and extending in the z direction is not yet restored completely at the examination area. Consequently, in the second sequence following this sequence the nuclear magnetic resonance signal is smaller and it decreases from sequence to sequence. After about 20 to 30 sequences, however, a stationary condition is attained, from which the amplitude of the nuclear magnetic resonance signals no longer decreases substantially. If only the echo signals are used for reconstruction, which are recorded after the stationary condition is attained, no falsifications are obtained. The signal-to-noise ratio then depends upon the flip angle of the high-frequency pulse. The best signal-to-noise ratio is obtained if for the flip angle a holds the relation:

$$a = \arccos(\exp(-tr/T1))$$

where T1 is the longitudinal relaxation time and tr is the period of a sequence. In general, however, the optimum contrast is obtained only at larger flip angles. As a rule, use is therefore made of a larger flip angle than is obtained from the above formula, but which is distinctly smaller than 90°.

What is claimed is:

1. A method for nuclear magnetic resonance tomography, comprising the steps of providing, in the presence of a homogeneous stationary magnetic field, a large number of sequences which act upon an examination area, each sequence including the production of a single high-frequency pulse, switching-on at least one magnetic gradient field having a gradient varying in accordance with amplitude or direction from sequence to sequence, recording a nuclear magnetic resonance signal during or after the action of said magnetic gradient field, and after the recording of the nuclear magnetic resonance signal, applying at least one magnetic gradient field having such a direction and amplitude that the time integral across all the magnetic gradient fields active during one sequence is different from zero and is equal for all sequences.

2. A method as claimed in claim 1, in which each sequence comprises successively a selection stage in which said high-frequency pulse and a first magnetic gradient field act upon the examination area, a preparation stage in which a second magnetic gradient field having a gradient amplitude which varies from sequence to sequence acts upon the examination area, a reading stage in which a third magnetic gradient field acts upon the examination area and the nuclear magnetic resonance signal then produced is recorded, and the reading stage is followed by a further stage ($t_3$–$t_4$), during which the second magnetic gradient field ($Gy$) is switched so that the time integral across the second magnetic gradient field has the same value, preferably zero, for all sequences.

3. A method as claimed in claim 1, in which each sequence comprises a selection stage in which said high-frequency pulse and a first magnetic gradient field act upon the examination area and a reading stage in which a further magnetic gradient field having an amplitude equal for all sequences, but having a direction variable from sequence to sequence, is switched and in which a nuclear magnetic resonance signal produced at the examination area is recorded, and after the reading stage, a magnetic gradient field ($Gx$, $Gy$) is switched off and on, whose direction is opposite to the direction of the magnetic gradient field active in the reading stage and whose amplitude is chosen so that the time integral across the second magnetic gradient field is zero for all sequences.

4. A method as claimed in claim 2 or 3, characterized in that in the stage following the reading stage the first magnetic gradient field ($Gz$) is switched on and off with a phase position equal for all sequences.

5. An arrangement for carrying out the method claimed in claim 1 comprising means for producing a homogeneous stationary magnetic field, means for producing high-frequency pulses, means for producing at least one magnetic gradient field having a value or direction of the gradient variable from sequence to sequence, and means for recording nuclear magnetic resonance signals, characterized in that the means (3,5,7; 23,25,27) for producing the gradient field or gradient fields are controlled by control means (15) in such a manner that the time integral across all the magnetic gradient fields active during one sequence is equal and different from zero for all sequences.

* * * * *